United States Patent
Funabashi et al.

(10) Patent No.: US 6,704,342 B1
(45) Date of Patent: Mar. 9, 2004

(54) GAIN-COUPLED DISTRIBUTED-FEEDBACK SEMICONDUCTOR LASER DEVICE

(75) Inventors: Masaki Funabashi, Tokyo (JP); Akihiko Kasukawa, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 221 days.

(21) Appl. No.: 09/676,989

(22) Filed: Oct. 2, 2000

(30) Foreign Application Priority Data

Sep. 30, 1999 (JP) ........................................... 11-278435
Sep. 29, 2000 (JP) ...................................... 2000-298502

(51) Int. Cl.⁷ ................................................. H01S 3/08
(52) U.S. Cl. ......................................... 372/96; 372/102
(58) Field of Search .................................. 372/102, 96

(56) References Cited

U.S. PATENT DOCUMENTS

| | | | | |
|---|---|---|---|---|
| 4,829,535 A | * | 5/1989 | Utaka | ........................... 372/45 |
| 5,727,015 A | | 3/1998 | Takahashi et al. | |
| 5,802,096 A | * | 9/1998 | Okuda | ......................... 372/102 |
| 5,852,625 A | | 12/1998 | Takahashi | |
| 6,399,404 B2 | * | 6/2002 | Sakata | ........................... 385/14 |

FOREIGN PATENT DOCUMENTS

JP  05160505 A  *  6/1993  ............. H01S/3/18

OTHER PUBLICATIONS

Patent Abstracts of Japan, vol. 013, No. 416 (E–821), Sep. 14, 1989, JP 01–155677, Jun. 19, 1989.
Patent Abstracts of Japan, vol. 010, No. 170 (E–412), Jun. 17, 1986, JP 61–023383, Jan. 31, 1986.
Guo Ping Li, et al., IEEE Journal of Quantum Electronics, vol. 29, No. 6, pp. 1736–1742, "Partly Gain–Coupled 1.55 μm Strained–Layer Multiquantum–Well DFB Lasers", Jun. 1993.

* cited by examiner

*Primary Examiner*—Jerome Jackson
*Assistant Examiner*—Matthew C. Landau
(74) *Attorney, Agent, or Firm*—Oblon, Spivak, McClelland, Maier & Neustadt, P.C.

(57) ABSTRACT

A gain-coupled DFB semiconductor laser device has a resonator and a diffraction grating which feeds-back the emission from the resonator to increase wavelength selectively. The gain-coupled coefficient $\kappa_g$ and the length $L_g$ of the diffraction grating satisfy the following relationship:

$$0.5 \leq |\kappa_g| \times L_g \leq 1.1.$$

The yield rate of the DFB laser device with respect to the single-longitudinal mode lasing characteristic is improved.

18 Claims, 6 Drawing Sheets

GAIN-COUPLED DISTRIBUTED-FEEDBACK SEMICONDUCTOR LASER DEVICE

BACKGROUND OF THE INVENTION (a) Field of the Invention

The present invention relates to a gain-coupled distributed feedback (DFB) semiconductor laser device and, more particularly, to a gain-coupled DFB semiconductor laser device having a single-longitudinal mode, lasing characteristic and capable of being fabricated with a higher yield rate (or higher percentage of the non-defected products to the total products).

(b) Description of the Related Art

A DFB laser device is known having a diffraction grating formed in the vicinity of an active area of the laser device, wherein only a laser component having a specific wavelength is fed-back to the resonator to allow the semiconductor laser device to have a lasing wavelength selectivity. The diffraction grating has a function for changing the real part and/or the imaginary part of the complex refractive index periodically with space in the resonator of the semiconductor laser device.

The DFB laser devices are categorized into two types including a refractive-index-coupled DFB laser which has a diffraction grating wherein only the real part of the refractive index is changed in the resonator, and a gain-coupled DFB laser (complex-coupled DFB laser) having a diffraction grating wherein both the real part and the imaginary part of the refractive index are changed in the resonator.

It is known that the conventional refractive-index-coupled DFB laser-device generally has a small difference in the threshold gain between a pair of modes sandwiching therebetween a Bragg wavelength. Thus, the refractive-index-coupled DFB laser device is liable to lasing in the pair of modes so that it is difficult to achieve the single-longitudinal mode lasing.

An effort is made to incorporate the gain-coupled structure in the refractive-index-coupled laser device, to enlarge the difference in the threshold gain between the pair of modes sandwiching therebetween the Bragg wavelength and to improve the yield rate with respect to the single-longitudinal mode lasing characteristic. The gain-coupled structure includes a diffraction grating in the vicinity of the laser active layer which gives the gain or loss of the stimulated emission and generates a feed-back at a certain wavelength thereby assisting the lasing in the single-longitudinal mode.

The term "gain-coupled DFB laser" as used herein means a laser structure wherein at least the imaginary part of the complex refractive index is changed periodically in space along the longitudinal direction of the elongate laser active layer.

The gain-coupled DFB laser device has advantages of excellent single-longitudinal mode selectivity and high endurance against external optical feedback. A gain-coupled DFB laser device having a wavelength shorter than 1 micrometer is generally important as a light source in a light measurement system, high-speed optical transmission system or optical storage device, whereas a gain-coupled DFB laser device having a wavelength longer than 1 micrometer is generally important as a light source in a long-distance optical transmission system.

In the DFB laser device; parameter κ is used for specifying the intensity of reflectance or feed-back ratio of the diffraction grating in the DFB laser device. The parameter K is defined by the coupling ratio of the field intensity of the backward wave to the field intensity of the forward wave in the laser. Refractive-index-coupling parameter $\kappa_i$ and gain-coupling parameter $\kappa_g$ are defined for the refractive-index-coupled DFB laser device and the gain-coupled DFB laser device, respectively.

The coupling parameter is determined by the optical confinement factor of the diffraction grating and by the difference between the real part and the imaginary part of the refractive index of the diffraction grating. In the gain-coupled DFB laser device, the gain-coupling coefficient $\kappa_g$ is expressed by the following formula:

$$\kappa_g = \frac{k_0^2}{2\beta} \Gamma_{abs} \frac{\alpha_{abs} n_{abs}}{\pi m k_0} \sin(\pi m D) \qquad (1)$$

wherein $k_0$, $\beta$, $\alpha_{abs}$, $n_{abs}$, m, D and $\Gamma_{abs}$ are wave number of the free space, transmission factor in the Z-direction, absorption coefficient of the absorption layer, refractive index of the absorption layer, order of the diffraction grating, duty ratio of the diffraction grating and optical confinement factor of the part having a periodic absorption layer, respectively. In the above formula, Γabs is expressed as follows:

$$\Gamma_{abs} = \frac{\int_{periodic} E(x) \cdot E(x) * dx}{\int_{-\infty}^{+\infty} E(x) \cdot E(x) * dx} = P \cdot d_{abs}$$

wherein
  x: direction normal to the substrate,
  E(x): x-component of the electric field,
  E(x)*: conjugate of E(x),
  $d_{abs}$: thickness of the optical absorption layer, and
  $\int_{periodic}$: integral over the periodic absorption layer The gain-coupling coefficient $\kappa_g$ is an important parameter, wherein a larger gain-coupling coefficient means that the laser device has an excellent single-longitudinal mode lasing characteristic. The laser characteristics such as threshold current largely depend on the gain-coupling coefficient $\kappa_g$, and the yield rate with respect to the single-longitudinal mode lasing characteristic also depends on the gain-coupling coefficient $\kappa_g$.

The types of diffraction grating used in the gain-coupled DFB laser device include two types: a gain-perturbative diffraction grating which periodically perturbs the gain of the active layer and an absorptive diffraction grating which effectively generates periodic perturbation of the gain by providing periodic optical absorption layers in the vicinity of the active layer.

The absorptive diffraction grating is extensively studied in consideration of the advantage of the fabrication feasibility thereof compared to the gain-perturbative diffraction grating. However, there is a problem in that the absorptive diffraction grating involves a poor reproducibility during the fabrication process, to thereby degrade the yield rate of the laser device with respect to the single-longitudinal mode lasing characteristic, and to have a poor reproducibility in the device characteristics.

Proposals have been made for solving the above problems. In an example of such a proposal, a gain-coupled DFB laser lasing at a wavelength of about 800 nm includes an absorptive diffraction grating having a duty ratio between 0.4 and 0.8 and a thickness of 6 to 30 nm for the absorption layer to improve the yield rate of the semiconductor laser device. It is reasoned that such a diffraction grating is well controlled during the fabrication.

The term "duty ratio" as used herein means the volumetric ratio of the periodic absorption layers to the whole layers in which the periodic absorption layers are disposed. If the cross section of the periodic absorption layer is rectangular, the duty ratio D ($0 \leq D \leq 1$) is obtained by the formula D=W/Λ wherein Λ is the length of one cycle of the diffraction grating and W is the width of the one cycle of the optical absorption layer.

The proposed technique has yet the following problems or tasks to be solved or finished.

First, although the duty ratio proposed therein resides between 0.4 and 0.8, it is suggested that the duty ratio should be as low as possible in view of the loss. Thus, it is important to find an appropriate range for the duty ratio and to raise the controllability and the reproducibility of the duty ratio within the appropriate range.

Second, the gain-coupling coefficient should be optimized for the semiconductor laser device having a longer resonator. This is because the resonator has become longer and longer to obtain a higher output power in the gain-coupled DFB laser device. In the above publication, the resonator discussed has a relatively small length such as about 250 micrometers, and thus if the resonator is longer than the recited length for achieving a higher output power, the above range for the duty ratio may not necessarily afford optimum device characteristics because the optimum value for the gain-coupling coefficient $\kappa_g$ depends on the length of the resonator.

More specifically, it is not assured whether or not the optimum value for the gain-coupling coefficient in the semiconductor laser device having a relatively short resonator coincides with an optimum value for the gain-coupling coefficient for obtaining a higher yield rate in a semiconductor laser device having a single-longitudinal lasing mode. Thus, the optimum value for the gain-coupling coefficient should be determined for obtaining a higher yield rate with respect to the single-longitudinal mode lasing characteristic in a semiconductor laser device having a longer resonator.

Third, the design value for the gain-coupling coefficient should be determined to a concrete value. A lower gain-coupling coefficient $\kappa_g$ does not afford effective gain-coupling and thus may degrade the yield rate with respect to the single-longitudinal mode lasing characteristic of the gain-coupled laser device down to a value comparable to the poor yield rate of the refractive-index-coupled laser device. In this case, the semiconductor laser device is liable to lasing at the pair of adjacent wavelengths sandwiching therebetween the stop band or Bragg, wavelength.

On the other hand, a larger gain-coupling coefficient $\kappa_g$ raises the threshold gain difference between the pair of adjacent wavelengths sandwiching therebetween the stop band due to a larger influence by the gain-coupling coefficient. However, the yield rate of the semiconductor laser device with respect to the single-longitudinal mode lasing characteristic is also degraded because the other threshold gain difference is lowered between adjacent two lasing wavelengths disposed on one side of the stop band.

In the publication, the upper limit is determined solely by the absorption loss. However, the upper limit of the optimum gain-coupling coefficient is considered to be lower than the value discussed in the above publication.

SUMMARY OF THE INVENTION

In view of the above, it is an object of the present invention to provide a gain-coupled DFB semiconductor laser device which has a relatively low duty ratio and a diffraction grating having a gain-coupling coefficient that is optimum for the single-longitudinal mode lasing characteristic and a higher yield rate of the semiconductor laser device.

The present invention provides a gain-coupled DFB semiconductor laser device including a substrate, at least one elongate active layer for stimulated laser emission, and a diffraction grating overlying the laser active layer to feedback the laser emission thereby allowing the laser active layer to lase, the diffraction grating having a structure wherein gain or loss of the laser emission changes periodically along an extending direction of the elongate active layer, a gain coupling coefficient $\kappa_g$ and a length Lg of the diffraction grating satisfying the following relationship:

$$0.5 \leq |\kappa_g| \times Lg \leq 1.1.$$

In accordance with the gain-coupled DFB semiconductor laser device of the present invention, the specific range of the product $|\kappa_g| \times Lg$ affords a higher yield rate of the DFB semiconductor device with respect to the single longitudinal mode lasing characteristic, thereby reducing the total cost for the gain-coupled DFB semiconductor laser device.

The above and other objects, features and advantages of the present invention will be more apparent from the following description, referring to the accompanying drawings.

PREFERRED EMBODIMENT OF THE INVENTION

Before describing the embodiment of the present invention, the principle of the present invention will be described for a better understanding of the present invention.

Conventionally, it is generally considered that the yield rate of the gain-coupled DFB semiconductor laser device with respect to the single-longitudinal mode lasing characteristic depends on the gain-coupling coefficient, as discussed above. The present inventors conducted a variety of experiments for achieving a higher output power for the gain-coupled DFB semiconductor laser device by increasing the length of the resonator, and found an irregularity occurred in the yield rate of the semiconductor laser devices having an equal gain-coupling coefficient.

Thus, the present inventors studied the factors causing the irregularity in the yield rate of the semiconductor laser device with respect to the single-longitudinal mode lasing characteristic, with the gain-coupling coefficient being maintained constant.

The present inventor also found that the duty ratio of the diffraction grating could be strictly controlled within an error around ±0.05 by using an electron beam exposure technique or a dry etching technique. In addition, it is found that the duty ratio could be controlled within an error ±0.1 in the wet etching process by setting before the etching a suitable value for the duty ratio of the etching mask made of a resist film.

The present inventor thus fabricated samples for the gain-coupled DFB semiconductor laser device lasing at a wavelength around 1550 nm, the samples including absorptive diffraction gratings having different gain-coupling coefficients and including resonators of different lengths. These samples were studied for the relationship between the gain-coupling coefficient and the yield rate with respect to the single-longitudinal mode lasing characteristic, with the length for the resonator being a parameter. The different gain-coupling coefficients were obtained by different thicknesses of the absorption layers.

Samples #1 to #14

Figure 2A:
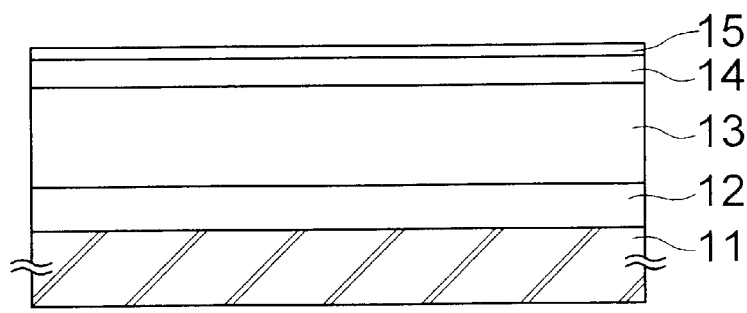
FIGS. 2A to 2I are sectional views of a sample semiconductor laser device, showing consecutive steps for fabrication thereof.

These samples had diffraction gratings over the entire length for the resonator. FIGS. 2A to 2I show the fabrication steps of these samples. As shown in FIG. 2A, an n-type InP (n-InP) buffer/cladding layer 12, a multiple-quantum-well separate-confinement-heterostructure (MQW-SCH) active layer assembly 13, a 100-nm-thick p-InP spacer layer 14, and a 10-nm-thick InGaAs absorption layer 15 were consecutively grown on an n-InP substrate 11 by a MOCVD technique at a substrate temperature of 600° C.

Figure 2B:
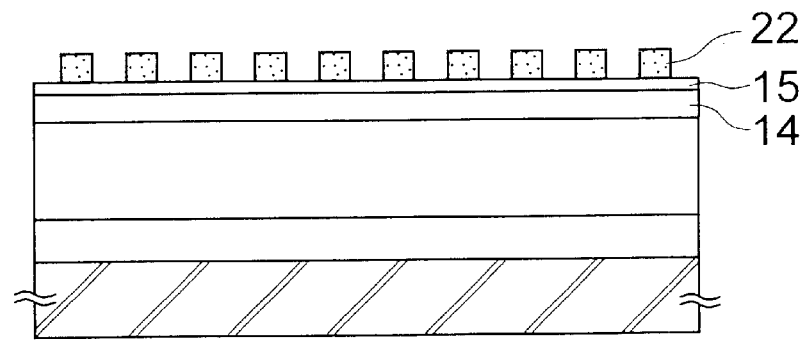

Subsequently, as shown in FIG. 2B, a 100-nm-thick photoresist film was formed by coating, followed by patterning thereof for drawing using an electron beam exposure system to form an etching mask 22 which had a diffraction grating pattern having a duty ratio of 0.5 and a space period of about 240 nm.

Figure 2C:
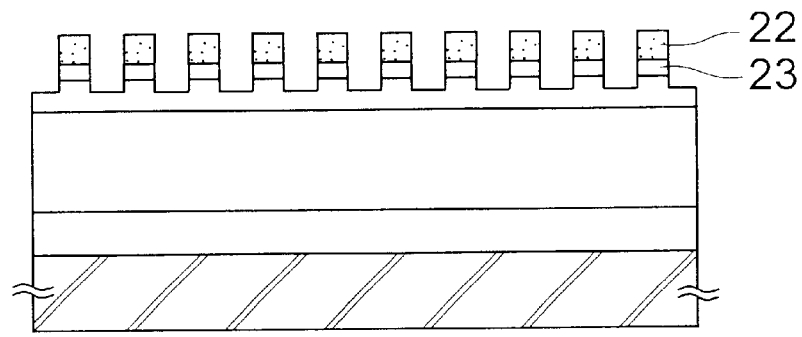

Thereafter, as shown in FIG. 2C, the InGaAs absorption layer 15 was patterned by etching using the etching mask 22 and a bromine-based etchant which had substantially non-selectivity between the InGaAs absorption layer 15 and the InP spacer layer 14, thereby forming a plurality of trenches which penetrated the InGaAs absorption layer 15 to reach a depth of 10 nm in the InP spacer layer 14 as viewed from the interface between the InP spacer layer 14 and the InGaAs absorption layer 15. Thus, a diffraction grating 23 having a duty ratio of 0.3 was formed after the etching.

Figure 2D:
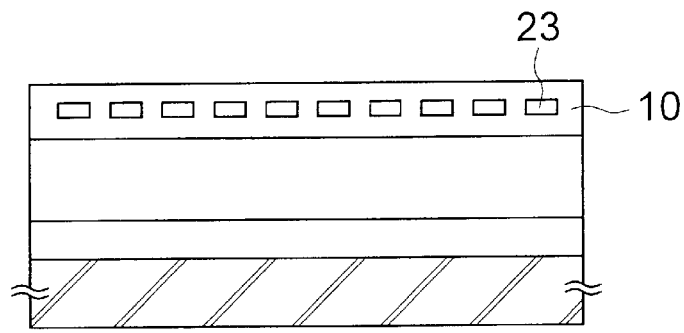

After removing the etching mask 22, as shown in FIG. 2D, a p-InP spacer layer 14 was re-grown using a MOCVD technique, whereby re-growth of the diffraction grating 23 was conducted for embedding. The re-growth step was conducted at a substrate temperature of about 520° C. so that the resultant diffraction grating 23 had no deformation. Thus, the surface of the resultant diffraction grating 23 was planarized.

Figure 2E:
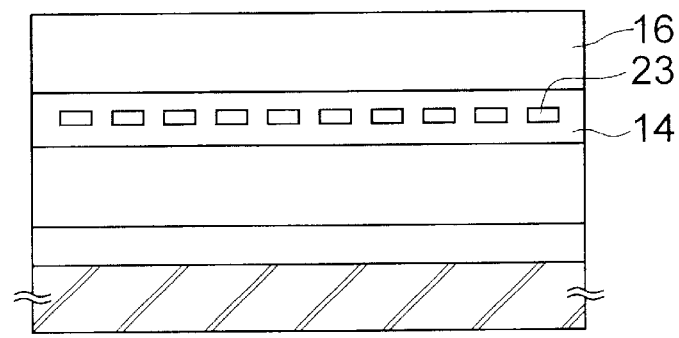
Figure 2F:
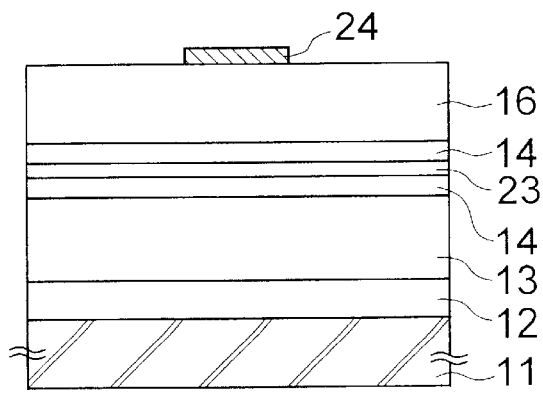

Subsequently, as shown in FIG. 2E, a p-InP upper cladding layer 16 was formed on the entire surface, followed by plasma-enhanced CVD to form a SiNx film (not shown) on the p-InP upper cladding layer 16. Thereafter, the SiNx film is patterned using a photolithographic and reactive ion etching (RIE) technique to form an etching mask 24. The stripe width of the etching mask 24 was adjusted to a specific width, which allowed the active layer to have a width of 1.5 micrometers at the mesa stripe.

Figure 2G:
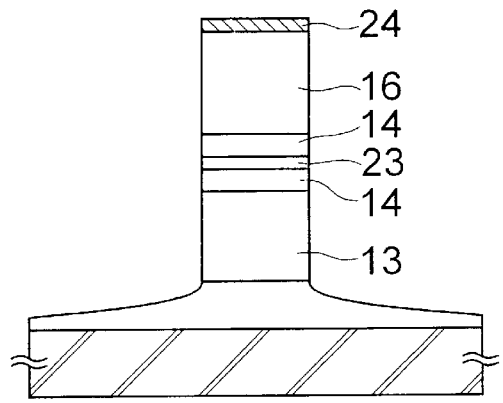
Figure 2H:
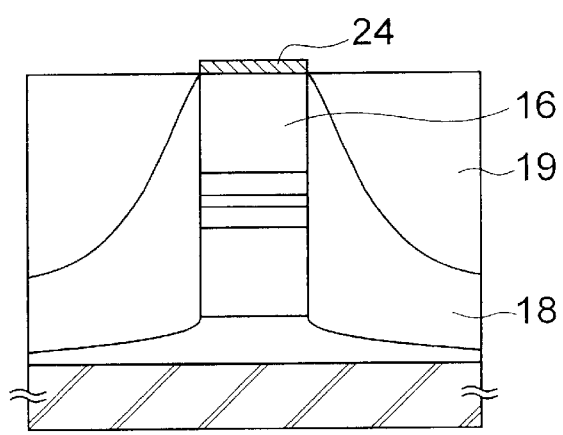

Thereafter, as shown in FIG. 2G, the upper cladding layer 16, InP spacer layer 14 including the diffraction grating 23, active layer 13 and a top portion of the cladding layer 12 were etched using the etching mask 24 to form a mesa stripe. Then, as shown in FIG. 2H, a p-InP embedding layer 18 and an n-InP embedding layer 19 were consecutively grown by a selective growth technique using a SiNx layer 24 as a selective growth mask, thereby forming a current blocking layer having a p-n junction on both the sides of the mesa stripe. Thus, a buried heterostructure semiconductor laser device could be obtained.

Figure 2I:
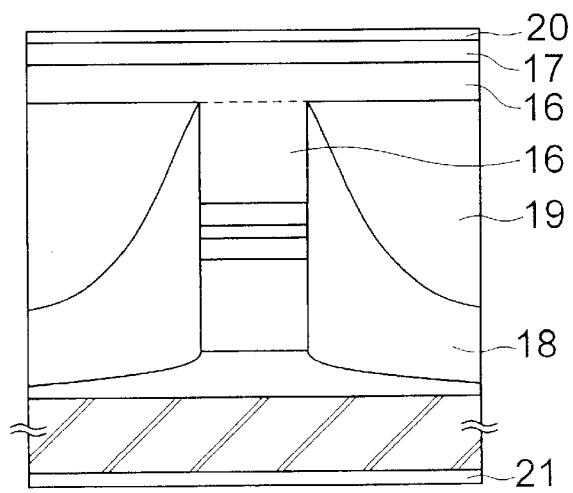

Thereafter, as shown in FIG. 2I, the SiNx mask 24 is removed, followed by consecutively growing a 2-μm-thick p-InP cladding layer 16 and 0.3-μm-thick heavily doped p-GaInAs contact layer 17. Then, a p-side electrode 20 made of Ti/Pt/Au films is formed on the GaInAs contact layer 17, followed by polishing the substrate 11 at the bottom surface thereof to a thickness of about 120 micrometers, and forming an n-side electrode 21 made of AuGeNi on the bottom surface of the substrate 11.

Further, cleavage of the resultant layer structure was conducted to form 300- to 900-μm-long resonators. The resultant semiconductor laser devices were bonded onto can package stems.

The semiconductor laser devices as obtained by the above process were subjected to measurements of I-L characteristic and spectrum characteristic with both the facets being left as cleaved, thereby estimating the characteristics of semiconductor laser devices having the coated facets.

The samples had different thicknesses 20, 30, 40 and 50 nm for the absorption layer 15 and different lengths for the resonator, some of which are shown in Table 1, with refractive-index-coupling coefficients, extracted gain-coupling coefficients, and calculated optical confinement factors.

TABLE 1

| Sample No. | #1 | #6 | #10 | #12 | #14 |
| --- | --- | --- | --- | --- | --- |
| Thickness of absorption layer (nm) | 10 | 20 | 30 | 40 | 50 |
| Refractive-index-coupling coefficient $\kappa_i(cm^{-1})$ | 19 to 22 | 39 to 43 | 60 to 64 | 76 to 81 | 97 to 104 |
| Extracted gain-coupling factor $\kappa_g(cm^{-1})$ | −7 to −8 | −16 to −18 | −23 to −26 | −32 to −35 | −40 to −44 |
| Calculated optical confinement factor (%) | 0.589 | 1.24 | 2.02 | 2.92 | 3.97 |

As shown in Table 1, a semiconductor laser device having a larger thickness for the absorption layer generally has a larger absolute value $|\kappa_g|$ for the gain-coupling coefficient.

For calculating the gain-coupling coefficients for the samples #1, #6, #10, #12 and #14 having different thicknesses for the absorption layers, extraction of the gain-coupling coefficients were conducted by using a technique wherein the spectra below the threshold were subjected to fitting. This technique is described in a literature entitled "First Observation of Changing Coefficients in a Gain-coupled DFB Laser with an Absorptive Grating by an Automatic Paramneter Extraction from Subthreshold Spectra", T. Nakuva et al. Proceedings of "1997 Conference on Lasers and Electro-optics (CREO'97).

In Table 1, negative values for the extracted gain-coupling coefficients mean that the structures of the semiconductor laser device were of out-of-phase type. The term "out-of-phase type" as used herein means that the structure of the complex-coupled DFB laser device is such that a portion of the diffraction grating having a higher refractive index has a lower gain. On the other hand, the type wherein a portion of the diffraction grating having a higher refractive index has a higher gain is called "in-phase type", wherein the gain-coupling coefficient assumes a positive value.

The layer structure was also cleaved so that the resultant chips had 400-μm-, 500-μm-, 600-μm- and 900-μm-long resonators and diffraction gratings. Samples #2–#5, #7–#9, #11 and #13 thus obtained were subjected to measurements of threshold current and yield rate with respect to the single-longitudinal mode lasing characteristic, the result of which are tabulated in Table 2 together with other samples. In this Table, the products each having a side-mode suppression ratio of 35 dB at a threshold current of +30 mA were categorized as non-defective products.

TABLE 2

| Sample | Thickness (nm) of absorption layer | gain-coupling coeff. $\kappa_g$ | resonator length "L" (μm) | diffraction grating length "Lg" (μm) | $\|\kappa_g\| \times$ Lg | yield rate (%) |
|---|---|---|---|---|---|---|
| 1 | 10 | −9 | 300 | 300 | 0.27 | 44 |
| 2 | 10 | −9 | 400 | 400 | 0.36 | 55 |
| 3 | 10 | −9 | 500 | 500 | 0.45 | 66 |
| 4 | 10 | −9 | 600 | 600 | 0.54 | 83 |
| 5 | 10 | −9 | 900 | 900 | 0.81 | 80 |
| 6 | 20 | −17 | 300 | 300 | 0.51 | 82 |
| 7 | 20 | −17 | 400 | 400 | 0.68 | 85 |
| 8 | 20 | −17 | 600 | 600 | 1.02 | 75 |
| 9 | 20 | −17 | 900 | 900 | 1.53 | 50 |
| 10 | 30 | −24 | 300 | 300 | 0.72 | 84 |
| 11 | 30 | −24 | 600 | 600 | 1.44 | 47 |
| 12 | 40 | −32 | 300 | 300 | 0.96 | 83 |
| 13 | 40 | −32 | 400 | 400 | 1.28 | 61 |
| 14 | 50 | −40 | 300 | 300 | 1.2 | 65 |

It is to be noted that a combination of a larger absolute value $|\kappa_g|$ (for example, $|\kappa_g|=17$) and a longer resonator significantly degrades the yield rate, as indicated by the results for the samples #9 and #11, for example.

Figure 3:
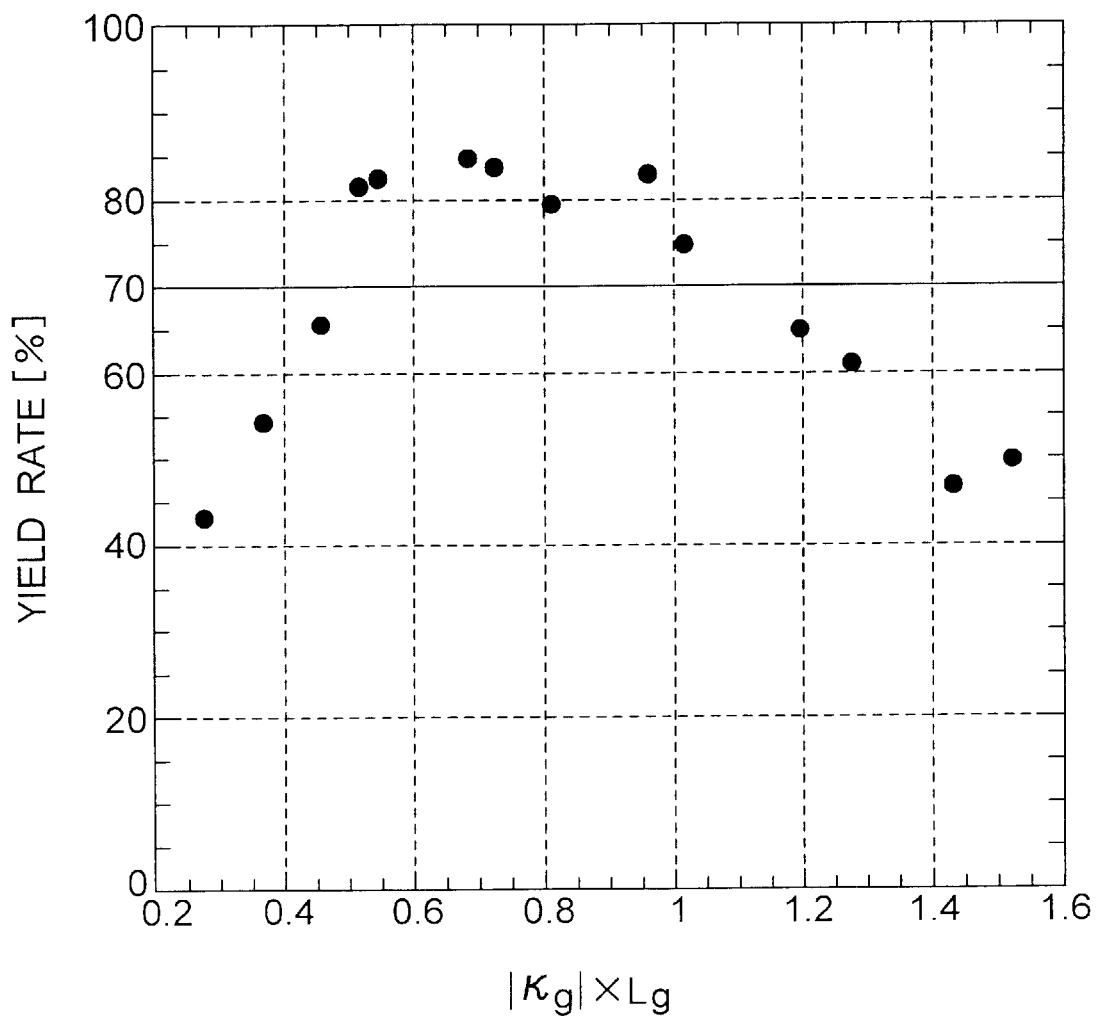
FIG. 3 is a graph for showing yield rates of sample semiconductor laser devices #1 to #14 plotted against $|\kappa_g| \times$ Lg.

Based on the results shown in Table 2, the relationship between the product $|\kappa_g| \times$ Lg of the absolute value $|\kappa_g|$ of the gain-coupling coefficient $\kappa_g$ by the length Lg of the resonator and the yield rate was examined, the results of which are shown in FIG. 3.

As understood from Table 2 and FIG. 3, the yield rate with respect to the single-longitudinal mode lasing characteristic depends on the product $|\kappa_g| \times$ Lg. In this respect, a higher yield rate such as above 70% can be obtained by the product $|\kappa_g| \times$ Lg ranging between 0.5 and 1.1, preferably the product ranging between 0.5 and 0.8.

In the samples, gain-coupled DFB semiconductor laser devices having out-of-phase type absorptive diffraction gratings were fabricated and subjected to measurements. However, the present invention is applicable to the gain-coupled DFB semiconductor laser devices having in-phase type diffraction gratings, theoretically without depending on the positive or negative values for the gain-coupling coefficient $\kappa_g$.

Although there is some possibility of difference in the threshold current between the out-of-phase type and the in-phase type, similar results can be obtained for the out-of-phase type and the in-phase type so long as the yield rate with respect to the single-longitudinal mode lasing characteristic is concerned.

In summary, for obtaining a higher yield rate of the DFB laser devices lasing in a single-longitudinal mode, the product $|\kappa_g| \times$ Lg of the absolute value of the gain-coupling coefficient $\kappa_g$ and the length Lg for the diffraction grating should satisfy the following relationship:

$$0.5 \leq |\kappa_g| \times Lg \leq 1.1,$$

and more preferably the following relationship:

$$0.5 \leq |\kappa_g| \times Lg \leq 0.8$$

Samples #15 to #30

Samples #15 to #30 had a diffraction grating on a specific portion of the resonator, and were different from the samples #1 to #14 wherein the diffraction grating was disposed over the entire length for the resonator.

The samples #15 to #30 were fabricated and subjected to measurements similarly to the samples #1 to #14 except that the diffraction grating was formed on a portion of the resonator in each of the samples #15 to #30. Table 3 shows the thickness of the absorption layer, extracted gain-coupling coefficient, length "L" for the resonator, length "Lg" for the diffraction grating, the products $|\kappa_g| \times$ Lg, and yield rate for each of the samples.

TABLE 3

| Sample | Thickness (nm) of absorption layer | gain-coupling coeff. $\kappa_g$ | resonator length "L" (μm) | diffraction grating length "Lg" (μm) | $\|\kappa_g\| \times$ Lg | yield rate (%) |
|---|---|---|---|---|---|---|
| 15 | 20 | −17 | 600 | 200 | 0.34 | 62 |
| 16 | 20 | −17 | 600 | 300 | 0.51 | 84 |
| 17 | 20 | −17 | 600 | 400 | 0.68 | 83 |
| 18 | 20 | −17 | 900 | 400 | 0.68 | 78 |
| 19 | 20 | −17 | 900 | 600 | 1.02 | 71 |
| 20 | 30 | −24 | 600 | 100 | 0.24 | 56 |
| 21 | 30 | −24 | 600 | 200 | 0.48 | 73 |
| 22 | 30 | −24 | 600 | 300 | 0.72 | 86 |
| 23 | 30 | −24 | 900 | 300 | 0.72 | 80 |
| 24 | 30 | −24 | 900 | 400 | 0.96 | 73 |
| 25 | 40 | −32 | 600 | 200 | 0.64 | 82 |
| 26 | 40 | −32 | 600 | 300 | 0.96 | 77 |
| 27 | 40 | −32 | 600 | 400 | 1.28 | 53 |
| 28 | 50 | −40 | 600 | 100 | 0.4 | 65 |
| 29 | 50 | −40 | 600 | 200 | 0.8 | 74 |
| 30 | 50 | −40 | 600 | 300 | 1.2 | 61 |

Figure 4:
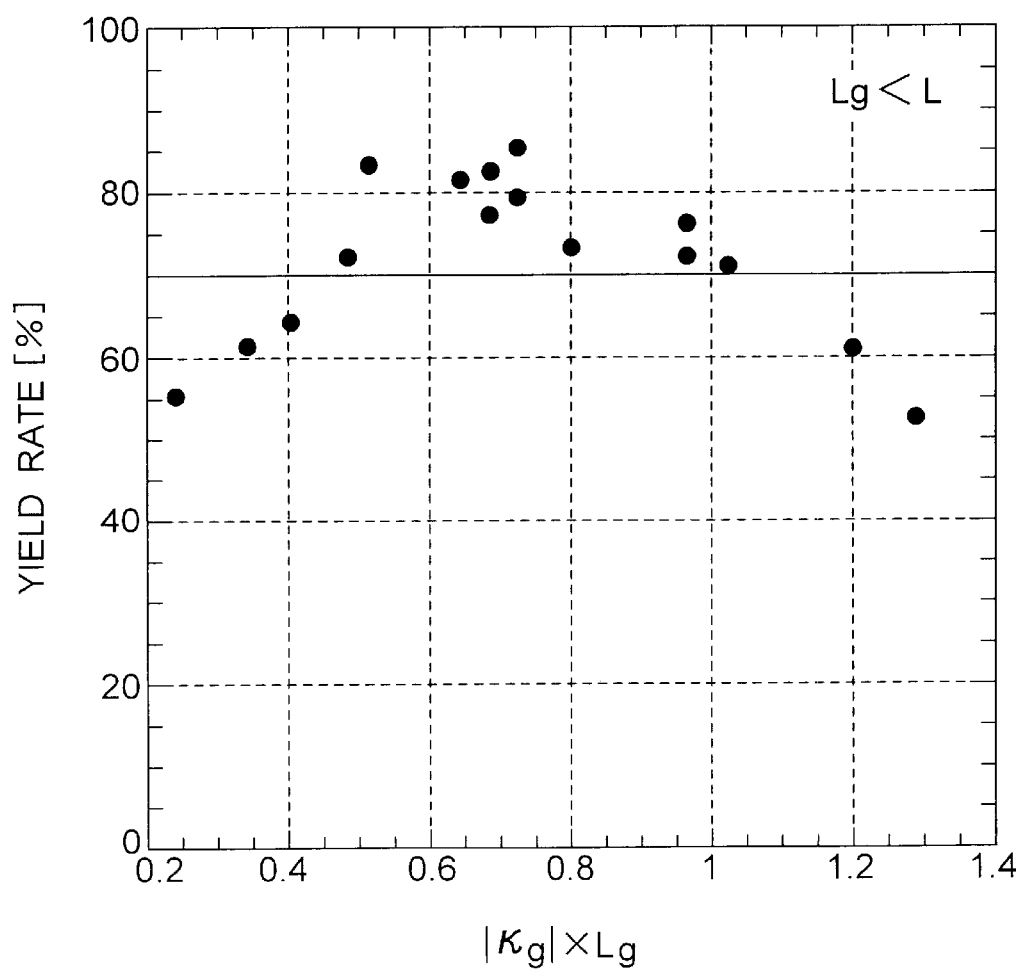
FIG. 4 is a graph for showing yield rates of sample semiconductor laser devices #15 to #30 plotted against $|\kappa_g| \times Lg$.

The relationship between the yield rate and the product $|\kappa_g| \times$ Lg is shown in FIG. 4.

From Table 3 and FIG. 4, it is understood that the yield rate with respect to the single-longitudinal mode lasing characteristic depends on the produce $|\kappa_g| \times$ Lg. In this respect, a higher yield rate such as above 70% can be obtained for the product $|\kappa_g| \times$ Lg ranging between 0.5 and 1.1, and more preferably ranging between 0.5 and 0.8.

From the experimental results of the samples #1 to #30, it was found that a higher yield rate with respect to the single-longitudinal mode lasing characteristic can be obtained by a suitable range for the product $|\kappa_g| \times$ Lg regardless of whether the diffraction grating is disposed on the entire length of the resonator or a portion of the resonator.

A longer resonator generally provides a higher output power for the semiconductor laser device due to reduction of the electric resistance and the thermal resistance. In fact, a semiconductor laser device having a 600-μm-long resonator had a maximum output power which was 1.6 times higher than the maximum output power of another semiconductor laser device having a 300-μm-long resonator, wherein a thermal saturation occurred more-quickly.

By providing a higher reflectance and a lower reflectance on the rear and front facets, respectively, of the resonator, a higher output efficiency from the front facet can be achieved. In the case of sample #22, for example, shown in Table 3 and having a 600-μm-long resonator and a 300-μm-long diffraction grating, wherein the semiconductor laser device had a front reflectance of 3% and a rear reflectance of 95%, the output power efficiency improved by twice compared to the semiconductor laser device having front and rear reflectances of 30%. In this example, the diffraction grating was formed in the vicinity of the front facet or over a ½ length of the resonator at the front side.

As understood from the above results, although the optimum value of the gain-coupled coefficient for obtaining a higher yield rate with respect to the single-longitudinal mode lasing characteristic depends on the length for the resonator, the specific range of the product $|\kappa_g| \times Lg$ achieves the higher yield rate.

In the present invention, the length Lg of the diffraction grating is measured along the extending direction of the resonator and is expressed in centimeters. The diffraction grating need not be formed over the entire length of the resonator and may be formed on a part of the resonator, so long as the relationship $0.5 \leq |\kappa_g| \times Lg \leq 1.1$ holds. For example, the diffraction grating may be formed on the front side or emission side of the resonator to extend half the length of the resonator. The gain-coupling coefficient $\kappa_g$ is expressed in terms of $cm^{-1}$ and thus $|\kappa_g| \times Lg$ has no unit.

In order to obtain a desired value for $|\kappa_g| \times Lg$, the distance between the active layer (or active layer assembly) and the diffraction grating is adjusted. For example, the thickness of the p-InP spacer layer 14 is selected to adjust the value for $|\kappa_g|$. A larger distance between the active layer and the diffraction grating affords a smaller value for Γ abs and a smaller value for $|\kappa_g|$, and a smaller distance between the active layer and the diffraction grating affords a larger value for Γ abs and a larger value for $|\kappa_g|$.

In a preferred embodiment of the present invention, the length of the resonator is above 400 μm to obtain an improved thermal resistance and a lower electric resistance, whereby the gain-coupled DFB semiconductor laser device can have a higher output power.

In a more preferred embodiment, the duty ratio D satisfies the relationship $0.2 \leq D \leq 0.4$. By employing this range for the duty ratio D, the yield rate with respect to the single-longitudinal mode lasing characteristic can be improved and a lower threshold current can be obtained for improvement of device characteristics. A lower value for the duty ratio below 0.2 degrades the yield rate with respect to the single-longitudinal mode lasing characteristic, whereas a higher value for the duty ratio above 0.4 degrades the lasing performance due to excess loss.

Figure 1:
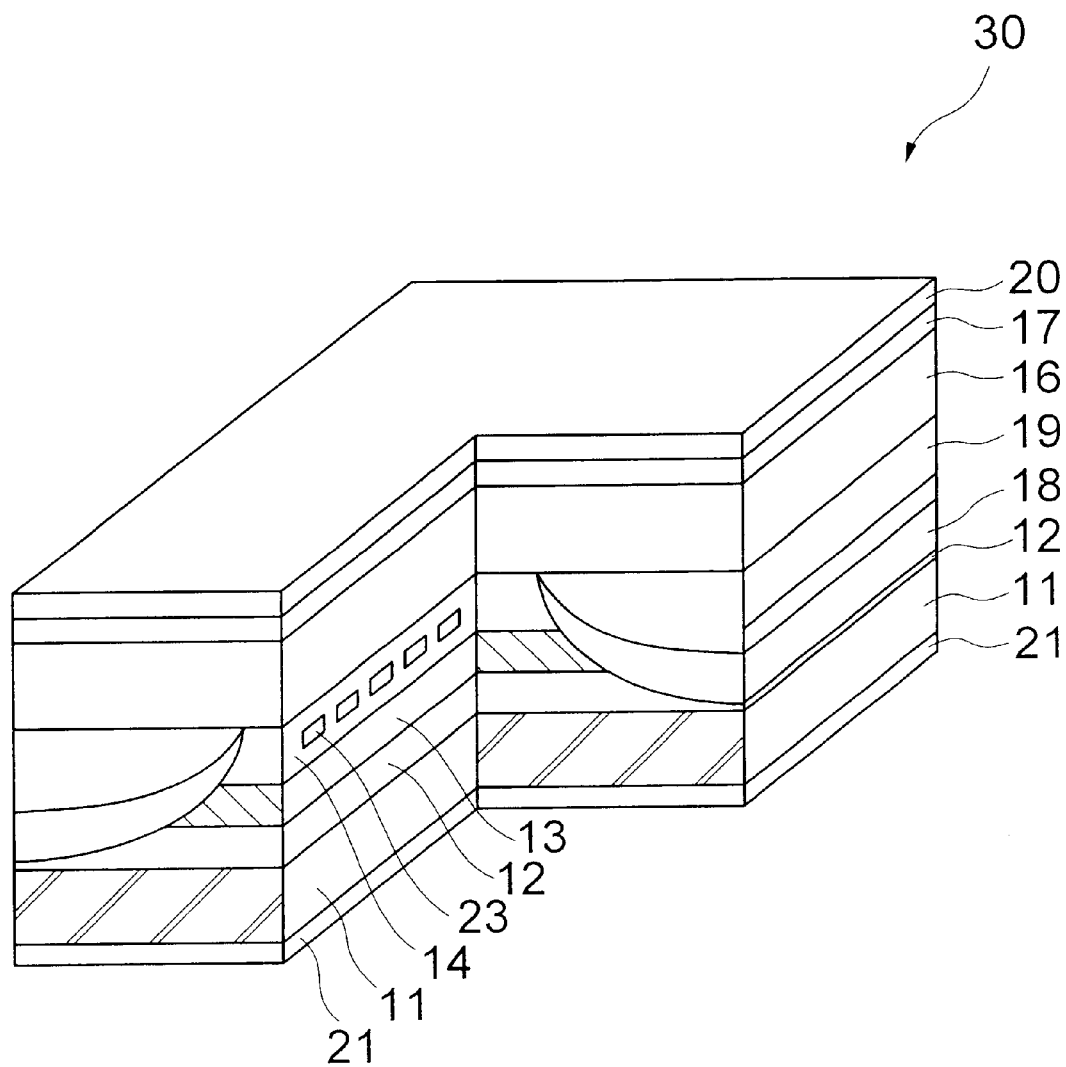
FIG. 1 is a partially-cutout perspective view of a gain-coupled DFB semiconductor laser device according to an embodiment of the present invention.

Now, the present invention is more specifically described with reference to a preferred embodiment thereof. Referring to FIG. 1, a gain-coupled DFB semiconductor laser device (hereinafter referred to as simply DFB laser) according to a first embodiment of the present invention has an absorptive diffraction grating and has a lasing wavelength around 1550 μm.

The DFB laser 20 includes a 120-μm-thick n-InP substrate 11, and a 1-μm-thick n-InP buffer/cladding layer 12, a 300-nm-thick MQW-SCH active layer assembly 13, a 200-nm-thick p-InP spacer layer 14, a 2-μm-thick p-InP upper cladding layer 16, and a 0.3-μm-thick p-GaInAs contact layer 17, which are consecutively formed on the n-InP substrate 11.

The p-InP spacer layer 14 including the diffraction grating 23, active layer assembly 13 and a top portion of the n-InP buffer/cladding layer 12 are configured to form a mesa stripe, both sides of which are embedded by current blocking layers including a p-InP embedding layer 18 and an n-InP embedding layer 19. The mesa stripe is about 1.5 μm wide at the depth of the active layer assembly. In the p-InP spacer layer 14, the diffraction grating 23 is disposed which includes the 20-nm-thick InGaAs absorption layer periodically formed at a pitch of about 240 nm along the extending direction of the mesa stripe. A p-side electrode 20 made of Ti/Pt/Au layers is formed on the contact layer 17, whereas an n-side electrode 21 made of AuGeNi is formed on the bottom surface of the substrate.

The resonator of the DFB laser is 500 μm long and the diffraction grating 23 is 500 μm (or 0.05 cm), and has a gain-coupling coefficient $\kappa_g$ of 12 $cm^{-1}$ whereby the product $|\kappa_g| \times Lg$ is 0.6. The duty ratio D is 0.3.

The DFB laser of the present embodiment has a higher yield rate with respect to the single-longitudinal mode lasing characteristic, due to the product $|\kappa_g| \times Lg$ being 0.6, and excellent device characteristics such as a low threshold current and high output power efficiency due to the duty ratio being 0.3.

The DFB laser device of FIG. 1 can be formed by a process shown in FIGS. 2A to 2I.

As shown in FIG. 2A, a 1-μm-thick n-InP buffer/cladding layer 12, a 300-nm-thick MQW-SCH active layer assembly 13, a 200-nm-thick p-InP spacer layer 14, and a 20-nm-thick InGaAs absorption layer 15 are consecutively grown on an n-InP substrate 11 by a MOCVD technique at a substrate temperature of 600° C.

Subsequently, as shown in FIG. 2B, a 100-nm-thick photoresist film is formed by coating, followed by patterning thereof using an electron beam exposure technique to form an etching mask 22 which has a diffraction grating pattern having a duty ratio of 0.3 and a space period of about 240 nm.

Thereafter, as shown in FIG. 2C, the InGaAs absorption layer 15 is patterned by etching using the etching mask 22 and a $CH_4/H_2$-based reactive ion etching (RIE) which has non-selectivity between the InGaAs absorption layer 15 and the InP spacer layer 14, thereby forming a plurality of trenches which penetrate the InGaAs absorption layer 15 to reach a depth of 10 nm in the InP spacer layer 14 as viewed from the interface between the InP spacer layer 14 and the InGaAs absorption layer 15. Thus, a diffraction grating 23 having a duty ratio of 0.3 is formed after the etching.

After removing the etching mask 22, as shown in FIG. 2D, a p-InP spacer layer 14 is re-grown using a MOCVD technique, whereby re-growth of the diffraction grating 23 is conducted for embedding. The re-growth step is conducted at a substrate temperature of about 520° C. so that the resultant diffraction grating 23 has no deformation. Thus, the surface of the resultant diffraction grating 23 is planarized.

Subsequently, as shown in FIG. 2E, a p-InP upper cladding layer 16 is grown on the entire surface, followed by plasma-enhanced CVD to form a SiNx film on the p-InP upper cladding layer 16. Thereafter, the SiNx film is patterned using a photolithographic and reactive ion etching (RIE) technique to form an etching mask 24. The stripe width of the etching mask 24 is adjusted to a specific width, which allows the active layer to have a width of 1.5 micrometers at the mesa stripe.

Thereafter, as shown in FIG. 2G, the upper cladding layer 16, InP spacer layer 14 including the diffraction grating 23, active layer assembly 13 and a top portion of the cladding layer 12 are etched using the etching mask 24 to form a mesa stripe. Then, as shown in FIG. 2H, a p-InP embedding layer 18 and an n-InP embedubg layer 19 are consecutively grown by a selective growth technique using a SiNx layer 24 as a selective growth mask, thereby forming a current blocking layer having a p-n junction on both the sides of the mesa stripe.

Thereafter, as shown in FIG. 2I, the SiNx mask is removed, followed by consecutively growing a 2-μm-thick p-InP cladding layer 16 and 0.3-μm-thick heavily doped p-GaInAs contact layer 17. Then, a p-side electrode 20 made of Ti/Pt/Au films is formed on the GaInAs contact layer 17, followed by polishing-the substrate 11 at the bottom surface thereof to a thickness of about 120 micrometers, and forming an n-side electrode 21 made of AuGeNi on the bottom surface of the substrate 11. Thus, a DFB laser device 30 of FIG. 1 can be obtained.

Since the above embodiments are described only for examples, the present invention is not limited to the above embodiments and various modifications or alterations can be easily made therefrom by those skilled in the art without departing from the scope of the present invention. For example, the active layer assembly may be a single active layer such as a SQW active layer.

What is claimed is:

1. A gain-coupled DFB semiconductor laser device comprising:
   at least one active layer;
   a resonator including said at least one active layer; and
   a diffraction grating configured to feed-back laser emission to said at least one active layer, to provide a gain coupling coefficient kg, and having a length Lg, wherein $0.5 \leq |\kappa g| \times Lg \leq 1.1$, and said resonator is equal to or larger than 400 μm.

2. The gain-coupled DFB semiconductor laser device as defined in claim 1, wherein $0.5 \leq |kg| \times Lg \leq 0.8$.

3. The gain-coupled DFB semiconductor laser device as defined in claim 1 or 2, wherein the length of said resonator is longer than Lg.

4. The gain-coupled DFB semiconductor laser device as defined in claim 1 or 2, wherein said diffraction grating has a duty ratio D satisfying $0.2 \leq D \leq 0.4$.

5. The gain-coupled DFB semiconductor laser device as defined in claim 3, wherein said diffraction grating has a duty ratio D satisfying $0.2 \leq D \leq 0.4$.

6. The gain-coupled DFB semiconductor laser device as defined in one of claims 1 or 2, comprising a front facet having a reflectance equal to or less than 5%, and a rear facet having a reflectance equal to or greater than 80%.

7. The gain-coupled DFB semiconductor laser device as defined in claim 3, comprising a front facet having a reflectance equal to or less than 5%, and a rear facet having a reflectance equal to or greater than 80%.

8. The gain-coupled DFB semiconductor laser device as defined in claim 4, comprising a front facet having a reflectance equal to or less than 5%, and a rear facet having a reflectance equal to or greater than 80%.

9. The gain-coupled DFB semiconductor laser device as defined in claim 5, comprising a front facet having a reflectance equal to or less than 5%, and a rear facet having a reflectance equal to or greater than 80%.

10. The gain-coupled DFB semiconductor laser device as defined in claim 9, wherein said front facet has a reflectance equal to or less than 1%, and said rear facet has a reflectance equal to or greater than 95%.

11. The gain-coupled DFB semiconductor laser device as defined in claim 4, wherein said diffraction grating is patterned by an electron beam exposure.

12. A laser comprising:
    means for generating stimulated emission;
    means for changing periodically in space at least the imaginary part of the complex refractive index of said means for generating, said means for changing having a length Lg; and
    means for setting a gain coupling kg for said stimulated emission so that $0.5 \leq |kg| \times Lg \leq 1.1$, wherein said means for generating have a length equal to or greater than 400 μm.

13. The laser of claim 12, wherein $0.5 \leq |kg| \times Lg \leq 0.8$.

14. The laser of claim 12, wherein the length of said means for generating is longer than Lg.

15. The laser of claim 12, wherein said means for changing has a duty ratio D, wherein $0.2 \leq D \leq 0.4$.

16. The method of claim 12, wherein said means for generating comprises:
    means for reflecting said stimulated emission at a reflectance equal to or less than 5%; and
    means for reflecting said stimulated emission at a reflectance equal to or greater than 80%.

17. A laser component for selecting a lasing wavelength for a laser active layer, comprising:
    a spacer layer formed on said laser layer,
    a resonator including said laser active layer, said resonator having a length equal to or greater than 400 μm, and
    a periodically structured absorbing layer having a length Lg,
    wherein said spacer layer and said periodically structured absorbing layer are configured to provide a gain coupling coefficient kg for stimulated emission in said laser active layer so that $0.5 \leq |kg| \times Lg \leq 1.1$.

18. The laser component of claim 17, wherein $0.5 \leq |kg| \times Lg \leq 0.8$.

* * * * *